United States Patent
Yang et al.

(10) Patent No.: US 9,496,047 B2
(45) Date of Patent: Nov. 15, 2016

(54) MEMORY CELL AND MEMORY

(71) Applicants: Jun Yang, Shanghai (CN);
Hwong-Kwo Lin, Palo Alto, CA (US);
Hua Chen, Shanghai (CN); Yong Li,
Shanghai (CN); Ju Shen, Shanghai
(CN)

(72) Inventors: Jun Yang, Shanghai (CN);
Hwong-Kwo Lin, Palo Alto, CA (US);
Hua Chen, Shanghai (CN); Yong Li,
Shanghai (CN); Ju Shen, Shanghai
(CN)

(73) Assignee: NVIDIA CORPORATION, Santa
Clara, CA (US)

( * ) Notice: Subject to any disclaimer, the term of this
patent is extended or adjusted under 35
U.S.C. 154(b) by 0 days.

(21) Appl. No.: 14/011,606

(22) Filed: Aug. 27, 2013

(65) Prior Publication Data
US 2014/0056050 A1 Feb. 27, 2014

(30) Foreign Application Priority Data

Aug. 27, 2012 (CN) .......................... 2012 1 0309244

(51) Int. Cl.
*G11C 7/12* (2006.01)
*G11C 17/08* (2006.01)
*G11C 7/20* (2006.01)

(52) U.S. Cl.
CPC ...... *G11C 17/08* (2013.01); *G11C 7/20* (2013.01)

(58) Field of Classification Search
CPC .................................. G11C 7/12; G11C 17/16
USPC .................................................. 365/103, 154
See application file for complete search history.

(56) References Cited

U.S. PATENT DOCUMENTS

| | | | |
|---|---|---|---|
| 3,241,122 A | 3/1966 | Bardell, Jr. | |
| 3,421,026 A | 1/1969 | Stopper | |
| 5,305,258 A * | 4/1994 | Koshizuka | 365/189.03 |
| 5,600,598 A | 2/1997 | Skjaveland et al. | |
| 5,694,355 A | 12/1997 | Skjaveland et al. | |
| 5,835,941 A | 11/1998 | Pawlowski | |
| 5,867,443 A * | 2/1999 | Linderman | 365/228 |
| 5,870,329 A | 2/1999 | Foss | |
| 5,949,706 A * | 9/1999 | Chang et al. | 365/156 |
| 6,041,008 A * | 3/2000 | Marr | 365/225.7 |
| 6,055,590 A | 4/2000 | Pettey et al. | |
| 6,084,856 A | 7/2000 | Simmons et al. | |
| 6,163,500 A | 12/2000 | Wilford et al. | |
| 6,263,331 B1 | 7/2001 | Liu et al. | |
| 6,263,410 B1 | 7/2001 | Kao et al. | |
| 6,265,922 B1 | 7/2001 | Kirsch | |
| 6,304,505 B1 | 10/2001 | Forbes et al. | |
| 6,366,529 B1 | 4/2002 | Williams et al. | |
| 6,400,735 B1 | 6/2002 | Percey | |
| 6,438,024 B1 * | 8/2002 | Gold et al. | 365/154 |
| 6,501,677 B1 * | 12/2002 | Rau et al. | 365/154 |
| 6,646,938 B2 | 11/2003 | Kodama | |

(Continued)

OTHER PUBLICATIONS

Rouse, Margaret; "Cache Memory", Sep. 2005, www.whatis.com.

(Continued)

*Primary Examiner* — Michael Tran (57) ABSTRACT

In various embodiments, a memory cell and a memory are provided. The memory cell comprises a Static Random Access Memory (SRAM) cell including a reset-set (RS) flip-flop and a Read Only Memory (ROM) cell being connected (or coupled) to the SRAM cell to set logic states of internal latch nodes of the RS flip-flop when the ROM cell is triggered. The size of the memory cells proposed in an embodiment of the invention is much smaller than the sum of the size of ROM cells and the size of SRAM cells with the capacity of the memory cells same as the sum of the capacity of the ROM cells and the capacity of the SRAM cells.

20 Claims, 3 Drawing Sheets

(56) References Cited

U.S. PATENT DOCUMENTS

| | | | |
|---|---|---|---|
| 6,803,610 B2 | 10/2004 | Koolhaas et al. | |
| 6,885,589 B2 | 4/2005 | Cioaca | |
| 6,987,775 B1 | 1/2006 | Haywood | |
| 7,051,169 B2* | 5/2006 | Ganton | 711/154 |
| 7,106,098 B1 | 9/2006 | Zack et al. | |
| 7,111,133 B2* | 9/2006 | Ishikawa et al. | 711/154 |
| 7,283,404 B2 | 10/2007 | Khan et al. | |
| 7,333,516 B1 | 2/2008 | Sikkink et al. | |
| 7,346,861 B1 | 3/2008 | Lee | |
| 7,414,903 B2* | 8/2008 | Noda | 365/201 |
| 7,498,850 B2 | 3/2009 | Hendrickson | |
| 7,499,347 B2 | 3/2009 | Chen et al. | |
| 7,603,246 B2 | 10/2009 | Newcomb et al. | |
| 7,613,030 B2* | 11/2009 | Iwata et al. | 365/154 |
| 7,724,606 B2* | 5/2010 | Osawa et al. | 365/233.13 |
| 7,739,538 B2 | 6/2010 | Fee et al. | |
| 7,783,911 B2 | 8/2010 | Chen et al. | |
| 8,164,934 B2 | 4/2012 | Watanabe et al. | |
| 8,332,957 B2* | 12/2012 | Hayasaka | 726/28 |
| 8,363,492 B2* | 1/2013 | Ishino et al. | 365/194 |
| 8,369,177 B2 | 2/2013 | Hold et al. | |
| 8,453,096 B2* | 5/2013 | Magee et al. | 716/132 |
| 8,488,360 B2* | 7/2013 | Okuda | 365/112 |
| 8,565,034 B1* | 10/2013 | Lu et al. | 365/193 |
| 8,570,818 B2 | 10/2013 | Jung et al. | |
| 8,760,208 B2 | 6/2014 | Dike et al. | |
| 8,830,766 B2 | 9/2014 | Sahu | |
| 8,908,449 B1* | 12/2014 | Ramaraju | 365/189.17 |
| 8,964,457 B2* | 2/2015 | Liaw | 365/156 |
| 2002/0089364 A1 | 7/2002 | Goldgeisser et al. | |
| 2003/0025217 A1 | 2/2003 | Song | |
| 2003/0120886 A1 | 6/2003 | Moller et al. | |
| 2005/0128844 A1 | 6/2005 | Yamagami | |
| 2006/0132209 A1 | 6/2006 | Meltzer et al. | |
| 2006/0136656 A1 | 6/2006 | Conley et al. | |
| 2007/0180006 A1 | 8/2007 | Gyoten et al. | |
| 2007/0253263 A1 | 11/2007 | Noda | |
| 2009/0119631 A1 | 5/2009 | Cortadella et al. | |
| 2009/0168499 A1 | 7/2009 | Kushida et al. | |
| 2010/0174877 A1 | 7/2010 | Yagihashi | |
| 2010/0306426 A1 | 12/2010 | Boonstra et al. | |
| 2011/0040906 A1 | 2/2011 | Chung et al. | |
| 2011/0168875 A1 | 7/2011 | Okuda | |
| 2012/0147680 A1 | 6/2012 | Koike | |
| 2012/0163068 A1 | 6/2012 | Houston | |
| 2013/0129083 A1 | 5/2013 | Fujino | |
| 2014/0003160 A1 | 1/2014 | Trivedi et al. | |
| 2014/0129745 A1 | 5/2014 | Alfieri | |
| 2014/0153341 A1 | 6/2014 | Alfieri | |
| 2014/0156891 A1 | 6/2014 | Alfieri | |
| 2014/0184268 A1 | 7/2014 | Alfieri et al. | |
| 2014/0244921 A1 | 8/2014 | Alfieri et al. | |
| 2014/0354330 A1 | 12/2014 | Gotterba et al. | |
| 2014/0355334 A1 | 12/2014 | Gotterba et al. | |
| 2014/0355362 A1 | 12/2014 | Wang et al. | |
| 2015/0016183 A1 | 1/2015 | Sinangil et al. | |

OTHER PUBLICATIONS

Sakai et al., "Prototype Implementation of a Highly Parallel Dataflow Machine em-4", Parallel Processing Symposium, 1991 Proceedings, Fifth International IEEE, 1991.

"Electronic/Flip Flops" Nov. 29, 2011, Wikibooks, <http://en.wikibooks.org/wiki/Electronics/Flip_Flops>, retrieved on Sep. 30, 2014.

"What is the Difference Between Static RAM and Dynamic RAM?", Aug. 24, 2000, HowStuffWorks.com, <http:///computer.howstuffworks.com/question452.htm> Retrieved Sep. 29, 2014.

* cited by examiner

MEMORY CELL AND MEMORY

CROSS-REFERENCE TO RELATED APPLICATION

This patent application claims the benefit and priority of the co-pending Chinese Patent Application No. 201210309244.9, filed on Aug. 27, 2012, by Jun YANG et al., which is hereby incorporated by reference in its entirety.

BACKGROUND

According to different functional uses, semiconductor memories can be classified as Random Access Memories (RAMs) (also referred to as read-write memory) and Read Only Memories (ROMs). And RAMs can be further classified as Static Random Access Memories (SRAMs) and Dynamic Random Access Memories (DRAMs).

As is known to all, data is written into a ROM by a specialized device and will not vanish when the ROM is powered off. In other words, the ROM is non-volatile. However, once data is written into a ROM, it cannot be optionally rewritten anymore. A SRAM can be accessed at a high speed. But after the SRAM is powered off, data in the SRAM will be lost.

Due to the characteristics of ROMs and SRAMs mentioned above, in a field of data processing, ROMs and SRAMs are both applied in many kinds of devices, such as personal digital assistants, tablet personal computers, and so on. Nevertheless, ROMs and SRAMs take up a very large amount of space, which makes it difficult to make data processing devices, such as handheld devices, become smaller and smaller as people are expecting.

SUMMARY

Thus, it is desirable for a memory cell as well as a memory to be provided to solve the above problems.

Various embodiments of the present invention are related to a memory cell and a memory.

In one embodiment of the invention, a memory cell is disclosed. The memory cell includes: a Static Random Access Memory (SRAM) cell including a basic reset-set (RS) flip-flop; and a Read Only Memory (ROM) cell being connected (or coupled) to the SRAM cell to set logic states of internal latch nodes of the basic RS flip-flop when the ROM cell is triggered.

In an optional implementation of an embodiment of the present invention, the ROM cell includes one transistor, which connects (or couples) one of the internal latch nodes of the basic RS flip-flop with the ground and a gate which is used to receive a triggering signal from a triggering word line.

Preferably, in an embodiment, the above-mentioned transistor is an NMOS transistor.

In another optional implementation of an embodiment of the present invention, the ROM cell includes: a first transistor, which connects (or couples) a first internal latch node of the basic RS flip-flop with the ground and a gate which is used to receive a triggering signal from a triggering word line; and a second transistor, wherein its source is connected (or coupled) to the ground and its drain is disconnected (or decoupled) from a second internal latch node of the basic RS flip-flop, and its gate is used to receive the triggering signal from the triggering word line.

In another optional implementation of an embodiment of the present invention, the ROM cell includes: a first transistor, which connects (or couples) a first internal latch node of the basic RS flip-flop with the ground and a gate which is used to receive a triggering signal from a triggering word line; and a second transistor, which connects (or couples) a second internal latch node of the basic RS flip-flop with the ground and a gate which is connected (or coupled) to the ground.

Preferably, in an embodiment, the first transistor and the second transistor mentioned above are NMOS transistors.

Preferably, in an embodiment, the first transistor and the first internal latch node of the basic RS flip-flop are connected (or coupled) through a metal layer, and the same is true with the second transistor and the second internal latch node of the basic RS flip-flop.

Optionally, in an embodiment, the ROM cell is connected (or coupled) to the SRAM cell through a diffusion, a contact, or a metal layer.

In an optional implementation of an embodiment of the present invention, the SRAM cell further includes pass transistors, which are used to connect (or couple) the internal latch nodes of the basic RS flip-flop with bit lines and gates which are used to connect (or couple) to word lines.

In an optional implementation of an embodiment of the present invention, the basic RS flip-flop includes two amplifiers that are reversely connected (or coupled).

Preferably, in an embodiment, the above mentioned SRAM cell is a RAM cell including 6 transistors.

According to another embodiment of the present invention, a memory is also provided, which comprises memory arrays. The memory array includes multiple memory cells, multiple bit lines, multiple word lines and multiple triggering word lines. Each of the multiple memory cells comprises: a SRAM cell including a basic RS flip-flop; and a ROM cell being connected (or coupled) to the SRAM cell to set logic states of internal latch nodes of the basic RS flip-flop when the ROM cell is triggered. Each of the multiple bit lines is connected (or coupled) to memory cells in a respective column. Each of the multiple word lines is connected (or coupled) to memory cells in a respective row. Each of the multiple triggering word lines is connected (or coupled) to memory cells in a respective row to trigger the ROM cells of the memory cells in the respective row.

In an optional implementation of an embodiment of the present invention, each ROM cell includes one transistor, which connects (or couples) one of the internal latch nodes of the basic RS flip-flop with the ground and a gate which is used to receive a triggering signal from the triggering word line.

In another optional implementation of an embodiment of the present invention, each ROM cell includes: a first transistor, which connects (or couples) a first internal latch node of the basic RS flip-flop with the ground and a gate which is used to receive a triggering signal from the triggering word line; and a second transistor, wherein its source is connected (or coupled) to the ground and its drain is disconnected (or decoupled) from a second internal latch node of the basic RS flip-flop, and its gate is used to receive the triggering signal from the triggering word line.

In another optional implementation of an embodiment of the present invention, each ROM cell includes: a first transistor, which connects (or couples) a first internal latch node of the basic RS flip-flop with the ground and a gate which is used to receive a triggering signal from the triggering word line; and a second transistor, which connects (or couples) a second internal latch node of the basic RS flip-flop with the ground and a gate which is connected (or coupled) to the ground.

Preferably, in an embodiment, each ROM cell is connected (or coupled) to its corresponding SRAM cell through a diffusion, a contact, or a metal layer.

In an optional implementation of an embodiment of the present invention, the multiple triggering word lines share a public triggering signal.

In another optional implementation of an embodiment of the present invention, each of the multiple triggering word lines receives a respective triggering signal.

Preferably, in an embodiment, the above-mentioned memory further comprises a read-only address decoding circuit, which is used to select an expected triggering word line among the multiple triggering word lines.

The size occupied by the memory cells in an embodiment of the present invention is smaller than the sum of the size taken by ROM cells and the size taken by SRAM cells, although the capacity of the memory cells is the same as the sum of the capacity of the ROM cells and the capacity of the SRAM cells. Therefore, the memory comprising such memory cells also is smaller, thus the volume of a device using a ROM and a SRAM at the same time is reduced in turn.

Additional features and advantages of various embodiments in accordance with the invention will be set forth in the description that follows, and in part will be apparent from the description, or may be learned by practice of various embodiments of the invention. The advantages of various embodiment in accordance with the invention will be realized and attained by the memory cell and the memory particularly pointed out in the written description and claims hereof as well as the appended drawings.

It is to be understood that both the foregoing general description and the following detailed description are exemplary and explanatory and are intended to provide further explanation of various embodiments in accordance with the invention as claimed.

While particular embodiments in accordance with the invention have been specifically described within this Summary, it is noted that the invention and the claimed subject matter are not limited in any way by these embodiments.

BRIEF DESCRIPTION OF THE DRAWINGS

The accompanying drawings are included to provide a further understanding of various embodiments in accordance with the invention, and are incorporated in and constitute a part of this specification. The drawings illustrate various embodiments of the invention and, together with the description, serve to explain the principles of various embodiments in accordance with the invention. In the drawings.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details or with equivalents thereof. In other instances, well known methods, procedures, components, and circuits have not been described in detail as not to unnecessarily obscure aspects of the invention.

Various embodiments in accordance with the present invention relate generally to a field of data storage and, in particular, to a memory cell as well as a memory.

Example embodiments are described herein in the context of a memory cell and a memory. Those of ordinary skill in the art will realize that the following description is illustrative only and is not intended to be in any way limiting. Other embodiments will readily suggest themselves to those skilled in the art having the benefit of this disclosure. Reference will now be made in detail to implementations of the example embodiments as illustrated in the accompanying drawings. The same reference numbers will be used to the extent possible throughout the drawings and the following description to refer to the same or like items.

Figure 1:
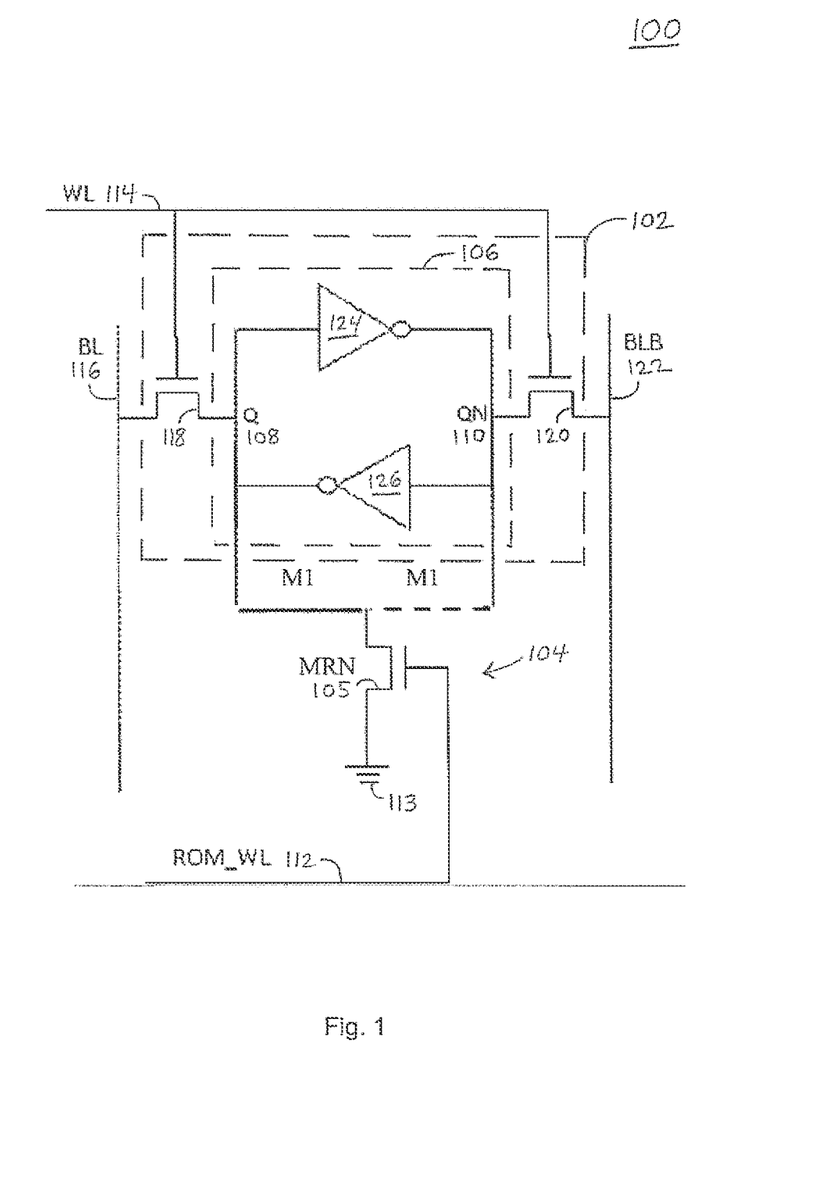
FIG. 1 is a schematic diagram of a memory cell according to a preferred embodiment of the present invention.

FIG. 1 is a schematic diagram of a memory cell 100 according to a preferred embodiment of the present invention, comprising a Static Random Access Memory (SRAM) cell 102 and a Read Only Memory (ROM) cell 104.

The SRAM cell 102 may include a basic reset-set (RS) flip-flop 106 to latch one-bit binary data. The basic RS flip-flop 106 may include an internal latch node Q 108 and an internal latch node QN 110 and data to be latched may be written into the basic RS flip-flop 106 by setting logic states of these internal latch nodes 108 and 110.

The ROM cell 104 is connected (or coupled) to the SRAM cell 102 to set the logic states of the internal latch nodes Q 108 and QN 110 of the basic RS flip-flop 106 when the ROM cell 104 is triggered.

In the above-mentioned memory cell 100, after the ROM cell 104 is triggered by a triggering signal from a triggering word line ROM_WL 112, the logic states of the internal latch nodes Q 108 and QN 110 of the basic RS flip-flop 106 can be set in accordance with a programming state of the ROM cell 104 to transmit data stored in the ROM cell 104 to the SRAM cell 102.

After the data stored in the ROM cell 104 is transmitted to the SRAM cell 102, if the memory cell 100 is read, what is read out is the data stored in the ROM cell 104. Hereinafter, this working mode of the memory cell 100 will be referred to as a ROM mode.

During the time that the triggering signal from the triggering word line ROM_WL 112 is low, the memory cell 100 works completely like a regular SRAM cell, regardless whether the ROM cell 104 is programmed to store a value "0" or "1". Hereinafter, this working mode of the memory cell 100 will be referred to as a SRAM mode.

In the memory cell 100 according to a preferred embodiment of the present invention, the SRAM cell 102 is combined with the ROM cell 104. The memory cell 100 proposed hereof can be easily configured to work in either the SRAM mode or the ROM mode. In an existing system where a ROM and a SRAM coexist, the ROM and the SRAM do not operate simultaneously. For example, the ROM is usually used for system startup after the system is powered up, and then keeps idle for a long time until the system is powered down, which is the busy time of the SRAM. Such a time slot distribution between the ROM and the SRAM makes it possible to combine them into one memory as proposed in various embodiments of this invention.

The memory cell 100 according to an embodiment of the present invention has the following advantages:

1) Small in size. According to an embodiment of the present invention, the ROM cell 104 and the SRAM cell 102 are combined into one memory cell 100 which includes only one set of peripheral circuitries. Although the memory including such memory cells is larger than a single SRAM or ROM with the same memory capacity, it is much smaller than a SRAM+ROM instance with the same storage capability because the ROM cell 104 and the SRAM cell 102 share one set of peripheral circuitries. Applications, each of which requires both a SRAM and a ROM, save a lot of area by combining SRAM cells and ROM cells, while resulting in almost zero performance penalties.

2) Easy to be reprogrammed. There are applications like Micro Controller Units (MCUs) that use ROMs to store fixed programs, where the ROMs are used as instruction memories to store fixed instruction sequences. As the applications become more sophisticated, it is hard to tell the whole instruction sequences before the on-board test. For many cases, the programmed data of the ROM needs to be adjusted or rewritten. This can be implemented by simply replacing the ROM with an EPROM or a Flash memory, which needs special processing steps and masks and may cause cost issues. Nevertheless, by using the memory cell 100 proposed by an embodiment of the present invention and taking the following steps, a content flexibility can be achieved. Firstly, the memory cell 100 may be placed into the ROM mode after the system is powered up and the original programmed data of the ROM may be written into the memory cell 100; and then the memory cell 100 may be placed into the SRAM mode, in which the memory cell 100 to be modified may be rewritten, like a regular SRAM cell. In other words, in an embodiment, the data trimming and correction should be implemented as a part of the whole system design, which acts as a patch for the pre-determined ROM code. The time to market of applications using the ROM can be reduced, because there is no ROM code reprogramming starting from the programming layer which usually takes months.

3) Being differential and operating fast. In prior technologies, there is only one bit line in a ROM, which needs an extra referential bit line to make it differential. According to various preferred embodiments of the present invention, the memory cell 100 is naturally differential due to the fact that read operations of the ROM cell 104 are completely the same as that of the SRAM cell 102. In other words, there is no need of extra effort to make the ROM cell 104 differential. Consequently, the memory cell 100 of an embodiment of the present invention runs faster than conventional ROMs.

4) Easy to perform ROM timing and power optimization. Conventional ROM designs tend to suffer from varied bit line capacitive loadings caused by different ROM codes. Extreme cases come up when every memory cell of a bit line is programmed to be physically connected (or coupled) to the bit line, which is the case of maximum bit line loading; or no cell of a bit line is programmed to be physically connected (or coupled) to the bit line, which is the case of minimum bit line loading. Difference of the bit line loadings between the above two extreme cases can be very large. This makes it difficult to perform ROM timing and power optimization, as each of the extreme cases should be considered and large margins shall be made to meet the extreme cases. However, in the memory cell 100 according to an embodiment of the present invention, loadings of all bit lines are the same with little variation, which make it easy to perform ROM timing and power optimization.

5) Without problem of bit line cross talk. Conventional ROM designs tend to suffer from the bit line cross talk problems, as the spaces between adjacent bit lines are very small. Compared with the conventional ROM designs, the memory cell 100 according to an embodiment of the present invention itself includes metal power lines and ground lines that shield the bit lines, thus the bit line cross talk problems are solved naturally.

6) Some data can be preserved after power down. Similar to conventional SRAMs, the memory cells according to various embodiments of the present invention can be accessed at high speed. But obviously different from the conventional SRAMs, for the memory cells according to various embodiments of the present invention, because the ROM cell 104 of the memory cell 100 has been preprogrammed, the preprogrammed data can be read even after the power is cut off simply by resetting the triggering signal.

In the memory cells according to an embodiment of the present invention, optionally, the ROM cell 104 and the SRAM cell 102 can be connected (or coupled) to each other by a diffusion, a contact, a metal layer or any other ways of connection (or coupling).

The working (or operational) procedure of the memory cell 100 will be described in detail in the following, according to specific embodiments of the present invention.

In the memory cell 100 according to the embodiment illustrated in FIG. 1, the ROM cell 104 may include one transistor MRN 105, which connects (or couples) one of the internal latch nodes of the basic RS flip-flop 106, Q 108 or QN 110, with the ground 113 and a gate of which is used to receive a triggering signal from a triggering word line ROM_WL 112.

FIG. 1 also shows a programming scheme of the transistor MRN 105 according to an embodiment. The transistor MRN 105 can be programmed to store read-only data by connecting (or coupling) its drain to the internal latch node Q 108 (as shown by the solid line) or QN 110 (as shown by the dashed line). If the drain of the transistor MRN 105 is connected (or coupled) to the internal latch node Q 108, then the transistor MRN 105 is programmed to store a value "0". Similarly, if the drain of the transistor MRN 105 is connected (or coupled) to node QN 110, then it is programmed to store a value "1".

The process that the value "0" or "1" stored in the transistor MRN 105 is written into the SRAM cell 102 is activated by a triggering signal. Under the condition that the drain of the transistor MRN 105 is connected (or coupled) with the internal latch node Q 108, when the triggering signal is set high, the internal latch node Q 108 will be pulled low, no matter what the original value in the internal latch node Q 108 is. When the triggering signal becomes low, a value "0" will be stably latched within the SRAM cell 102. Similar to the above process that the value "0" is stored, under the condition that the drain of the transistor MRN 105 is connected (or coupled) with the internal latch node QN 110, when the triggering signal is set high, the internal latch node QN 110 will be pulled low, no matter what the original value in the internal latch node QN 110 is; and when the triggering signal becomes low, a value "1" will be stably latched within the SRAM cell 102.

In the memory cell 100 as shown in FIG. 1, in an embodiment, the ROM cell 104 includes one transistor MRN 105. Relative to a regular SRAM cell, this memory cell 100 is only adding one transistor MRN 105, thanks to which the capacitive loading of the triggering word line ROM_WL 112 is relatively low, and the signal delay and the active power are smaller.

Those of ordinary skill in this art are able to understand that the transistor MRN 105 mentioned above can be a MOS transistor in an embodiment, for instance, an NMOS transistor.

Due to the high electron mobility of the NMOS transistor, the accuracy of data stored in the transistor 105 may be increased. Therefore, in an embodiment, the NMOS transistor and its adaptive connection (or coupling) are preferred.

In the memory cell 100 as shown in FIG. 1, preferably, in an embodiment, the transistor MRN 105 is connected (or coupled) with the internal latch node Q 108 or QN 110 through a metal layer M1. In an embodiment, the metal layer connection (or coupling) is in a later processing step than a diffusion connection (or coupling) or a contact connection (or coupling), thus enabling a reduction of the time cycle needed for reprogramming the ROM code.

Figure 2:
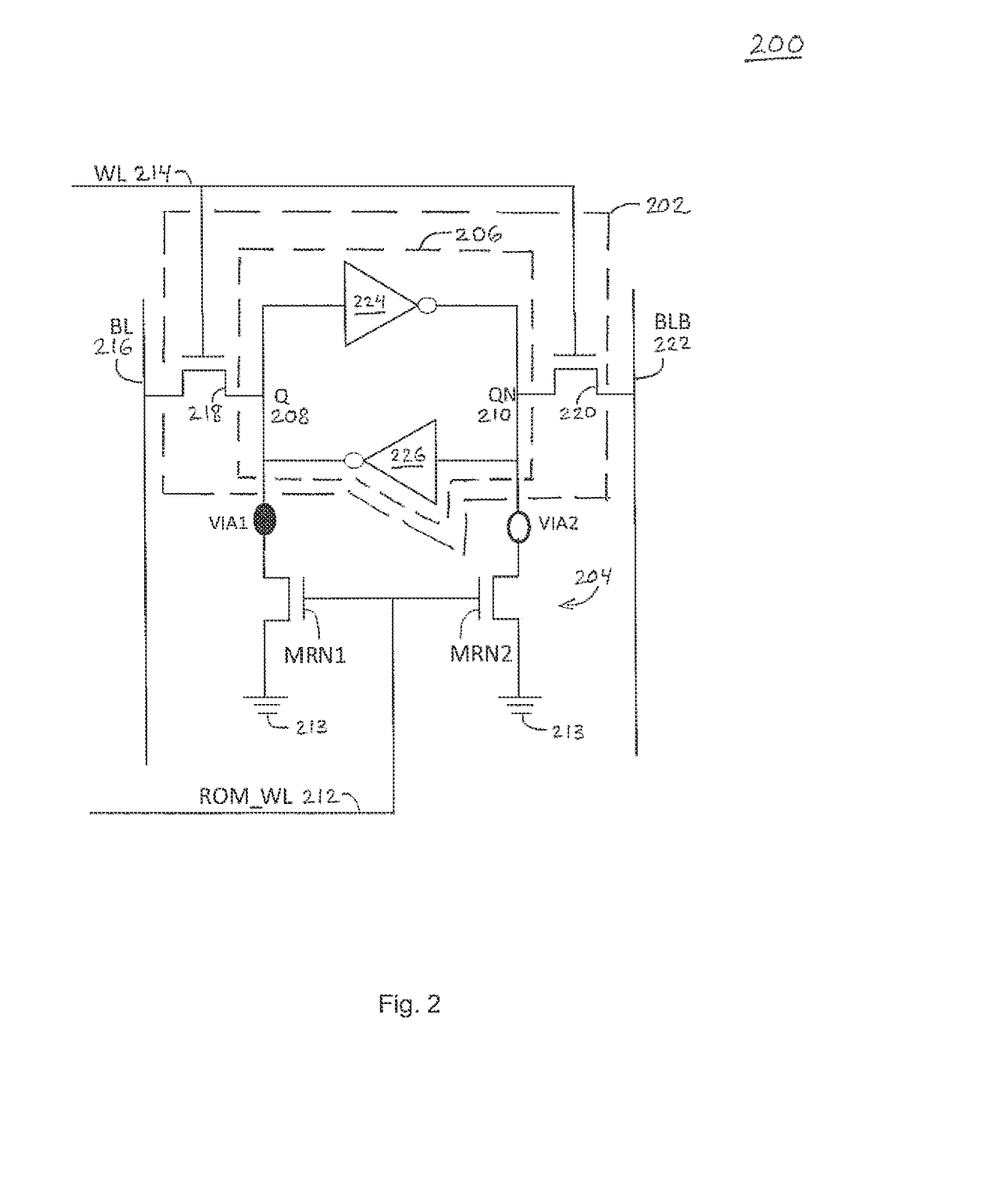
FIG. 2 is a schematic diagram of a memory cell according to another preferred embodiment of the present invention.

FIG. 2 is a schematic diagram of a memory cell 200 according to another preferred embodiment of the present invention.

In the memory cell 200 as shown in FIG. 2, the ROM cell 204 includes a first transistor MRN1 and a second transistor MRN2. The transistor MRN1 connects (or couples) a first internal latch node Q 208 of the basic RS flip-flop 206 with the ground 213, with its gate being used to receive a triggering signal from a triggering word line ROM_WL 212. The source of the transistor MRN2 is connected (or coupled) to the ground 213, while the drain of the transistor MRN2 is disconnected (or decoupled) from a second internal latch node QN 210 of the basic RS flip-flop 206. Similar to the transistor MRN1, the gate of the transistor MRN2 is also used to receive the triggering signal from the triggering word line ROM_WL 212. As shown in FIG. 2, there is the connection (or coupling) VIA1 between the transistor MRN1 and the corresponding internal latch node Q 208 represented by a solid circle, and there is the disconnection (or decoupling) VIA2 between the transistor MRN2 and the corresponding internal latch node QN 210 represented by an empty circle. In the programming scheme of the ROM cell 204 as shown in FIG. 2, the ROM cell 204 is programmed to store a value "0".

Those of ordinary skill in this art are able to understand that, in another programming scheme of the ROM cell 204 in FIG. 2, in an embodiment, it can be configured that the first transistor is the transistor MRN2, the second transistor is the transistor MRN1, the first internal latch node is QN 210 and the second internal latch node is Q 208. That is to say, the drain of the transistor MRN1 is disconnected (or decoupled) from the internal latch node Q 208, while the drain of the transistor MRN2 is connected (or coupled) to the internal latch node QN 210. In this case, the ROM cell 204 is programmed to store a value "1".

As is shown in FIG. 2, the first transistor and the first internal latch node are connected (or coupled) through a corresponding contact, VIA1 or VIA2. Those of ordinary skill in this art are able to understand that other ways of connection (or coupling), such as diffusion connections, can be adopted.

Preferably, in an embodiment, the first transistor (e.g., MRN1) and the second transistor (e.g., MRN2) are of the same type. More preferably, in an embodiment, both of them are NMOS transistors.

Figure 3:
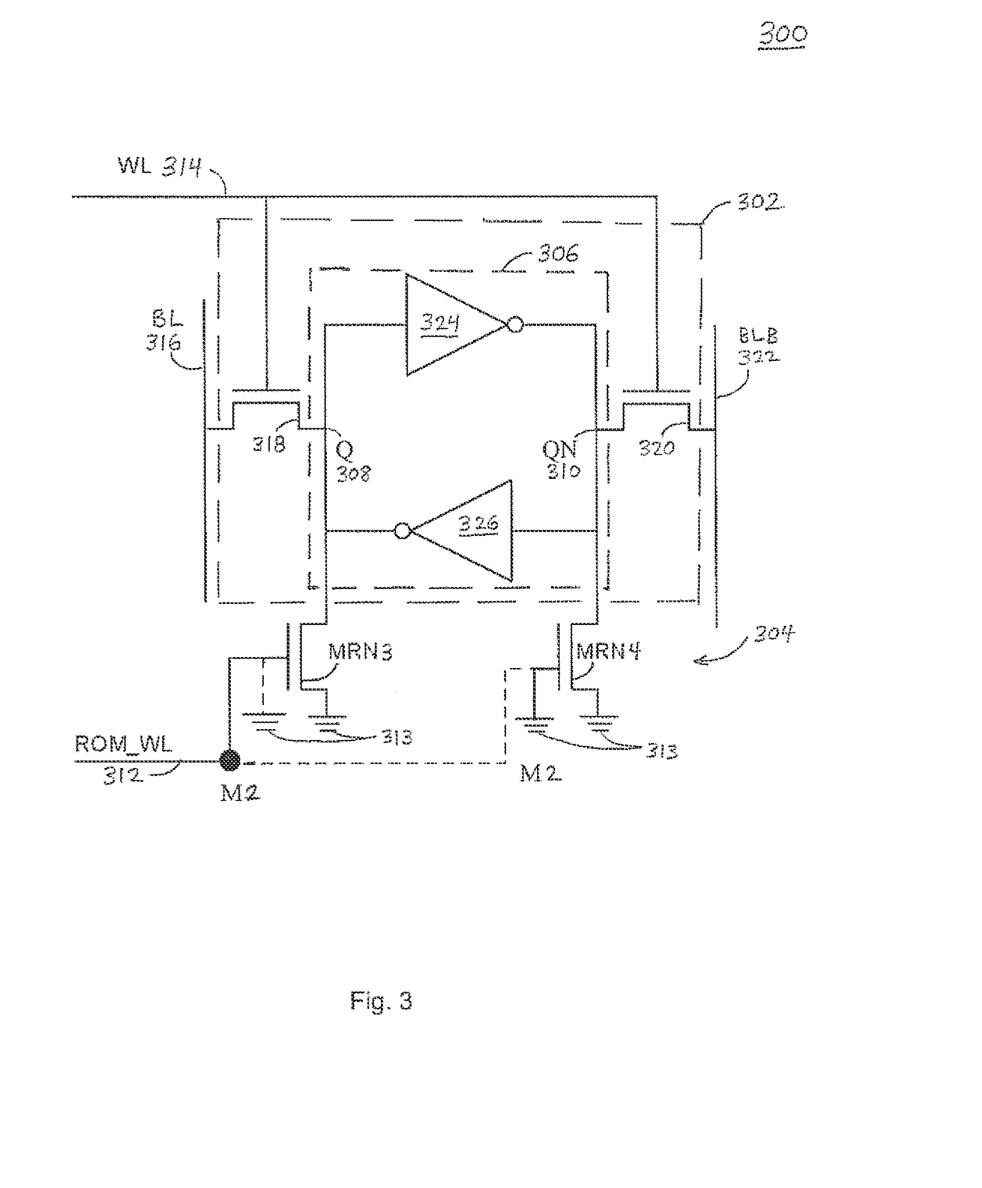
FIG. 3 is a schematic diagram of a memory cell according to a third preferred embodiment of the present invention.

FIG. 3 is a schematic diagram of a memory cell 300 according to a third preferred embodiment of the present invention.

In the memory cell 300 as shown in FIG. 3, the ROM cell 304 includes a first transistor MRN3 and a second transistor MRN4. The transistor MRN3 connects (or couples) a first internal latch node Q 308 of the basic RS flip-flop 306 with the ground 313, with its gate being used to receive a triggering signal from a triggering word line ROM_WL 312. The transistor MRN4 connects (or couples) a second internal latch node QN 310 of the basic RS flip-flop 306 with the ground 313, with its gate connected (or coupled) to the ground 313. In the programming scheme of the ROM cell 304 as indicated by solid lines in FIG. 3, in an embodiment, the ROM cell 304 is programmed to store a value "0".

Those of ordinary skill in this art are able to understand that, in another programming scheme of the ROM cell 304 as indicated by dashed lines in FIG. 3, in an embodiment, it can be configured that the first transistor is the transistor MRN4, the second transistor is the transistor MRN3, the first internal latch node is QN 310 and the second internal latch node is Q 308. That is, in an embodiment, the gate of the transistor MRN4 is connected (or coupled) to the triggering word line 312, while the gate of the transistor MRN3 is connected (or coupled) to the ground 313. The memory cell 300 herein is programmed to store a value "1".

In the memory cell 300 as shown in FIG. 3, the two internal latch nodes of the basic RS flip-flop 306, Q 308 and QN 310, are both connected (or coupled) to the transistors MRN3 and MRN4. When the memory cell 300 is working in SRAM mode, the loadings of the internal latch nodes Q 308 and QN 310 are substantially symmetrical, no matter whether the gate of the transistor MRN3 or the gate of the transistor MRN4 is connected (or coupled) to the triggering word line ROM_WL 312. The capacitive loading between the internal latch nodes Q 308 and QN 310 is in balance.

When the memory cell 300 as shown in FIG. 3 is working in the ROM mode, only one of the gate of the transistor MRN3 and the gate of the transistor MRN4 is connected (or coupled) to the triggering word line ROM_WL 312. Therefore, the capacitive loading of the triggering word line ROM_WL 312 is reduced to half of that of the memory cell 200 as shown in FIG. 2. So if the memory cell 300 is working in the ROM mode, its speed is faster and its consumption of power is lower.

Preferably, in an embodiment, the first and second transistors MRN3 and MRN4 are of the same type. More preferably, in an embodiment, both of them are NMOS transistors.

Preferably, in an embodiment, the way that the first transistor (e.g., MRN3) is connected (or coupled) to its corresponding internal latch node (e.g., Q 308) of the basic RS flip-flop 306 is the same as the way that the second transistor (e.g. MRN4) is connected (or coupled) to its corresponding internal latch node (e.g., QN 310) of the basic RS flip-flop 306. Based on the reason that is similar to the memory cell 100 shown in FIG. 1, preferably, in an embodiment, the first and second transistors MRN3 and MRN4 are connected (or coupled) to their corresponding internal latch nodes Q 308 and QN 310 of the basic RS flip-flop 306 through a metal layer M2.

As shown in FIG. 1, according to one embodiment of the present invention, the SRAM cell 102 can further include pass transistors 118 and 120, which are used to connect (or couple) the internal latch node Q 108 with a bit line BL 116 as well as to connect (or couple) the internal latch node QN 110 with a bit line BLB 122 and gates of which are used for connecting (or coupling) to word lines WL 114. As shown in FIG. 2, according to an embodiment of the present invention, the SRAM cell 202 can further include pass transistors 218 and 220, which are used to connect (or couple) the internal latch node Q 208 with a bit line BL 216 as well as to connect (or couple) the internal latch node QN 210 with a bit line BLB 222 and gates of which are used for connecting (or coupling) to word lines WL 214. As shown in FIG. 3, according to one embodiment of the present invention, the SRAM cell 302 can further include pass transistors 318 and 320, which are used to connect (or couple) the internal latch node Q 308 with a bit line BL 316 as well as to connect (or couple) the internal latch node QN 310 with a bit line BLB 322 and gates of which are used for connecting (or coupling) to word lines WL 314.

According to an embodiment of the present invention, the basic RS flip-flop 106 of FIG. 1 may include two amplifiers 124 and 126 that are reversely connected (or coupled). According to an embodiment of the present invention, the basic RS flip-flop 206 of FIG. 2 may include two amplifiers 224 and 226 that are reversely connected (or coupled). According to an embodiment of the present invention, the basic RS flip-flop 306 of FIG. 3 may include two amplifiers 324 and 326 that are reversely connected (or coupled).

In various embodiments, the SRAM cells 102, 202, and 302 shown in FIGS. 1-3 are RAM cells including 6 transistors (6T RAM cells). Those of ordinary skill in this art are able to understand that they can also be other memory cells such as RAM cells including 8 or 10 transistors (8T RAM cells or 10T RAM cells), in various embodiments.

Those of ordinary skill in the art are able to understand that, according to an embodiment of the present invention, the transistor MRN 105 of FIG. 1 can also be a PMOS transistor. At this point, this case is similar to the case where the transistor MRN 105 is an NMOS transistor, except that adaptation is needed to be conducted on the connections (or couplings) among the components of the memory cell 100. A detailed description about the adaptation will be given in the following.

In an embodiment, when the transistor MRN 105 is a PMOS transistor:

1) The transistor MRN 105 connects (or couples) one of the internal latch nodes Q 108 and QN 110 of the basic RS flip-flop 106 with the power source VDD, and its gate is used to receive the triggering signal from the programming word line ROM_WL 112.

2) When the drain of the transistor MRN 105 is connected (or coupled) to the internal latch node Q 108, the transistor MRN 105 will be programmed to store a value "1". Similarly, when the drain of the transistor MRN 105 is connected (or coupled) to the internal latch node QN 110, the transistor MRN 105 will be programmed to store a value "0".

3) When the triggering signal is set low, the value "0" or "1" stored in the transistor MRN 105 will be written into the SRAM cell 102.

According to another embodiment of the present invention, a memory is also provided, which comprises a memory array consisting of multiple above-mentioned memory cells. For the sake of brevity, specific descriptions of the memory cells recited by reference to the above embodiments are omitted. Those skilled in this art are able to understand the specific structures and the operation modes of the memory cells by reference to FIGS. 1-3 in combination with the above descriptions. Therefore, detailed descriptions about other parts of the memory array will be given in the following.

The memory array can further include: multiple bit lines BL and BLB, each of which is connected (or coupled) to memory cells in a respective column; and multiple word lines WL, each of which is connected (or coupled) to memory cells in a respective row. In addition, the memory array can further include multiple triggering word lines ROM_WL, each of which is connected (or coupled) to memory cells in a respective row and used for triggering the ROM cells of the memory cells in this respective row.

The size of the memory instance provided by an embodiment of the present invention is smaller than a ROM+SRAM instance with the same storage capability, due to its memory array including the memory cells wherein the SRAM cells and the ROM cells are combined.

According to an embodiment of the present invention, multiple of the above triggering word lines can share a public triggering signal. By activating a triggering pulse to the triggering word lines ROM_WL, the entire memory array can be written with the values stored in the ROM cells within a clock cycle, which can be named as a "ROM Initializing Cycle". After the ROM Initializing Cycle, in an embodiment, the triggering signal needs to keep low and the memory operates like a SRAM. Afterwards, the data read from the memory will be the data stored in the ROM cells until a writing operation is performed on the memory. After the writing operation, the data read from the memory will be the data written in.

Thus, those of ordinary skill in this art are able to understand that if the memory proposed herein is mostly applied in the SRAM mode, in an embodiment, the ROM cell of the memory cell can be used for initializing the memory with the fixed data stored therein within only one time cycle.

According to another embodiment of the present invention, each of the multiple triggering word lines can receive a respective triggering signal, thanks to which the memory cells in each row share a public triggering signal similar to a signal for the word line WL. Preferably, in this embodiment, the memory further includes a read-only address decoding circuit used for selecting an expected triggering word line among the multiple triggering word lines.

In an embodiment, access speed is further increased by activating each triggering word line by a triggering signal. When a read operation is performed in the ROM mode, a word line WL and a triggering word line ROM_WL are activated at the same time. The internal latch node Q or QN is firstly set according to data stored in the ROM cell, and then retain the data by means of latch. Because both the basic RS flip-flop of the SRAM cell and the ROM cell pull the bit line BL to the ground through the pass transistor, the bit line difference is constructed faster. As a result, the read current increases and the read speed increases in turn.

It should be appreciated that various modifications, adaptations and alternative embodiments thereof may be made within the scope and spirit of the present invention. The invention is further defined by the following claims.

The foregoing descriptions of various specific embodiments in accordance with the invention have been presented for purposes of illustration and description. They are not intended to be exhaustive or to limit the invention to the precise forms disclosed, and many modifications and variations are possible in light of the above teaching. The invention is to be construed according to the Claims and their equivalents.

What is claimed is:

1. A memory cell comprising:
   a Static Random Access Memory (SRAM) cell comprising a reset-set (RS) flip-flop; and
   a Read Only Memory (ROM) cell connected to the RS flip-flop of the SRAM cell to set logic states of internal latch nodes of the RS flip-flop when the ROM cell is triggered, the ROM cell comprising a transistor that couples one of the internal latch nodes of the RS flip-flop with ground and a gate of that is used to receive a triggering signal from a triggering word line.

2. The memory cell of claim 1, wherein the transistor is an NMOS transistor.

3. The memory cell of claim 1, wherein the ROM cell further comprising:
   a second transistor that couples one of the internal latch nodes of the RS flip-flop with the ground and a gate that is coupled to the ground.

4. The memory cell of claim 3, wherein the transistor and the second transistor are NMOS transistors.

5. The memory cell of claim 1, wherein the transistor and the one of the internal latch nodes of the RS flip-flop are coupled through a metal layer.

6. The memory cell of claim 1, wherein the ROM cell is connected to the RS flip-flop of the SRAM cell through a diffusion, a contact, or a metal layer.

7. The memory cell of claim 1, wherein the SRAM cell further comprises pass transistors, which are used to couple the internal latch nodes of the RS flip-flop with bit lines, the gates of the pass transistors are coupled to a word line.

8. The memory cell of claim 1, wherein the RS flip-flop comprises two amplifiers that are reversely coupled.

9. A memory array comprising:
   multiple memory cells, each memory cell comprising:
      a Static Random Access Memory (SRAM) cell comprising a reset-set (RS) flip-flop; and
      a Read Only Memory (ROM) cell coupled to the SRAM cell to set logic states of internal latch nodes of the RS flip-flop when the ROM cell is triggered;
   multiple bit lines, each bit line coupled to memory cells in a respective column;
   multiple word lines, each word line coupled to memory cells in a respective row; and
   multiple triggering word lines, each triggering word line coupled to memory cells in a respective row to trigger the ROM cells of the memory cells in the respective row.

10. The memory of claim 9, wherein said each ROM cell comprises a transistor that couples one of the internal latch nodes of the RS flip-flop with ground and a gate that is used to receive a triggering signal from the triggering word line.

11. The memory of claim 9, wherein said each ROM cell comprises:
   a first transistor that couples a first internal latch node of the RS flip-flop with ground and a gate of that is used to receive a triggering signal from the triggering word line; and
   a second transistor, wherein its source is coupled to the ground and its drain is decoupled from a second internal latch node of the RS flip-flop, and its gate is used to receive the triggering signal from the triggering word line.

12. The memory of claim 9, wherein said each ROM cell includes:
   a first transistor that couples a first internal latch node of the RS flip-flop with ground and a gate that is used to receive a triggering signal from the triggering word line; and
   a second transistor that couples a second internal latch node of the RS flip-flop with the ground and a gate that is coupled to the ground.

13. The memory of claim 9, wherein said each ROM cell is coupled to its corresponding SRAM cell through a diffusion, a contact, or a metal layer.

14. The memory of claim 9, wherein the multiple triggering word lines share a public triggering signal.

15. The memory of claim 9, wherein each of the multiple triggering word lines receives a respective triggering signal.

16. The memory of claim 15, further comprising a read-only address decoding circuit that is used to select an expected triggering word line among the multiple triggering word lines.

17. A memory cell comprising:
   a Static Random Access Memory (SRAM) cell comprising a reset-set (RS) flip-flop; and
   a Read Only Memory (ROM) cell connected to the RS flip-flop of the SRAM cell to set logic states of internal latch nodes of the RS flip-flop when the ROM cell is triggered, the ROM cell comprising:
      a first transistor that couples a first internal latch node of the RS flip-flop with ground and a gate that is used to receive a triggering signal from a triggering word line; and
      a second transistor, wherein its source is coupled to the ground and its drain is decoupled from a second internal latch node of the RS flip-flop, and its gate is used to receive the triggering signal from the triggering word line.

18. The memory cell of claim 17, wherein the first transistor and the second transistor are NMOS transistors.

19. The memory cell of claim 17, wherein the SRAM cell further comprising pass transistors, the gates of the pass transistors are coupled to a word line.

20. The memory cell of claim 17, wherein the ROM cell is connected to the RS flip-flop of the SRAM cell through a diffusion, a contact, or a metal layer.

* * * * *